| (12) | United States Patent | (10) Patent No.: | US 8,952,483 B2 |
|---|---|---|---|
| | Kaya et al. | (45) Date of Patent: | Feb. 10, 2015 |

(54) SEMICONDUCTOR DEVICE

(71) Applicant: Renesas Electronics Corporation, Kawasaki-shi, Kanagawa (JP)

(72) Inventors: Yoshinori Kaya, Kawasaki (JP); Yasushi Nakahara, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/095,304

(22) Filed: Dec. 3, 2013

(65) Prior Publication Data

US 2014/0167207 A1 Jun. 19, 2014

(30) Foreign Application Priority Data

Dec. 13, 2012 (JP) ................. 2012-272858

(51) Int. Cl.
*H01L 21/70* (2006.01)
*H01L 27/02* (2006.01)
*H01L 27/06* (2006.01)
*H01L 27/08* (2006.01)

(52) U.S. Cl.
CPC ........ *H01L 27/0207* (2013.01); *H01L 27/0635* (2013.01); *H01L 27/0814* (2013.01)
USPC ...................................... 257/500

(58) Field of Classification Search
CPC ................................. H01L 27/0207
USPC ...................................... 257/500
See application file for complete search history.

(56) References Cited

U.S. PATENT DOCUMENTS

| 7,868,414 | B2 * | 1/2011 | Williams et al. | 257/513 |
|---|---|---|---|---|
| 2008/0197446 | A1 * | 8/2008 | Disney et al. | 257/506 |
| 2008/0237782 | A1 * | 10/2008 | Williams et al. | 257/513 |
| 2010/0133611 | A1 * | 6/2010 | Disney et al. | 257/335 |
| 2011/0012196 | A1 * | 1/2011 | Williams et al. | 257/343 |
| 2011/0133269 | A1 * | 6/2011 | Yamaji | 257/328 |
| 2011/0198726 | A1 * | 8/2011 | Nitta et al. | 257/552 |
| 2011/0260246 | A1 * | 10/2011 | Disney et al. | 257/337 |
| 2011/0309438 | A1 * | 12/2011 | Ichijo et al. | 257/335 |

FOREIGN PATENT DOCUMENTS

JP 2012-4460 A 1/2012

* cited by examiner

*Primary Examiner* — Bilkis Jahan
(74) *Attorney, Agent, or Firm* — Sughrue Mion, PLLC

(57) ABSTRACT

A potential isolation element is provided separately from a diode. An n-type low-concentration region is formed on a P-type layer. A first high-concentration N-type region is positioned in the n-type low-concentration region and is connected to a cathode electrode of the diode. A second high-concentration N-type region is positioned in the n-type low-concentration region, is disposed to be spaced from a first second-conduction-type high-concentration region, and is connected to a power supply interconnection of a first circuit. A first P-type region is formed in the n-type low-concentration region, and a bottom portion thereof is connected to the P-type layer. A ground potential is applied to the first P-type region, and the first P-type region is positioned in the vicinity of the first high-concentration N-type region.

8 Claims, 17 Drawing Sheets

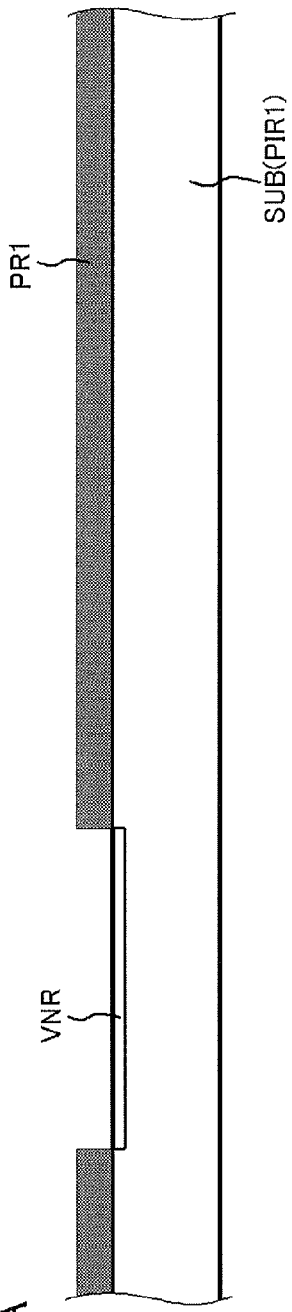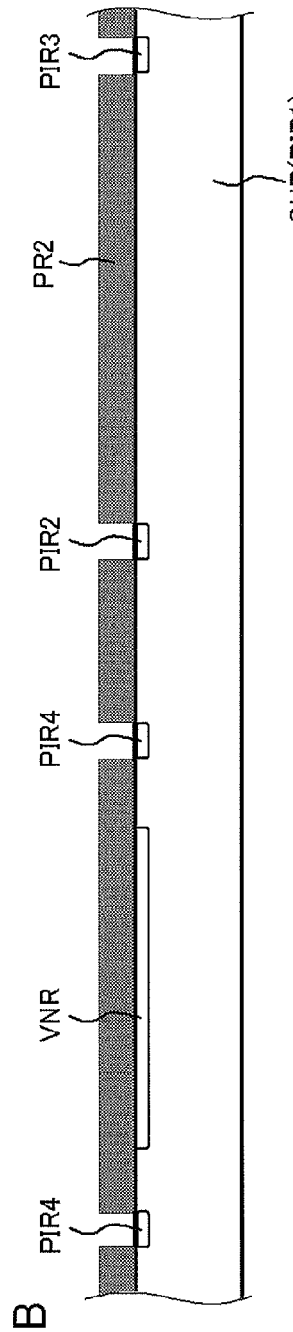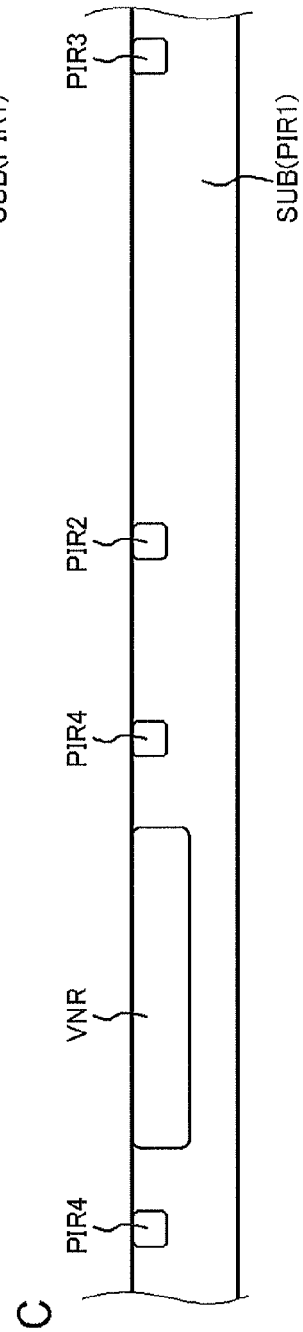

SEMICONDUCTOR DEVICE

This application is based on Japanese patent application No. 2012-272858, the content of which is incorporated hereinto by reference.

BACKGROUND

1. Technical Field

The invention relates to a semiconductor device, and is a technology applicable to, for example, a semiconductor device including a diode.

2. Related Art

Among semiconductor devices, there is one integrating a control circuit which generates a control signal of a power control element. In such a semiconductor device, a power supply voltage of the power control element is higher than a power supply voltage of the control circuit. Therefore, a second control circuit may be provided between the control circuit and the power control element to input the control signal to the power control element. Generally, a power supply voltage of the second control circuit is equal to or lower than the power supply voltage of the power control element and is higher than the power supply voltage of the control circuit. Therefore, it is necessary to generate the power supply voltage of the second control circuit separately from the power supply voltage of the control circuit.

A high-withstand voltage diode is used for a circuit that generates the power supply voltage of the second control circuit. For example, Japanese Unexamined Patent Application Publication No. 2012-4460 discloses a diode having the following structure. First, an n-type epitaxial layer is formed on a p-type substrate. In addition, a p-type layer and an $n^+$ layer that is connected to a cathode electrode are provided in the n-type epitaxial layer. In addition, a $p^+$ layer that is connected to an anode electrode is provided in the p-type layer. A withstand voltage of the diode is determined by a distance between the $n^+$ layer and the p-type layer.

SUMMARY

From an investigation made by the present inventors, it was found that in the structure disclosed in Japanese Unexamined Patent Application Publication No. 2012-4460, a parasitic bipolar transistor was formed due to the p-type substrate, an n-type epitaxial layer, and the p-type layer. When a potential of the n-type epitaxial substrate increases, the parasitic bipolar transistor starts to operate. Since a current of a diode flows in the epitaxial substrate, when the diode operates, the potential of the epitaxial substrate increases. Therefore, when the diode operates, the parasitic bipolar transistor also operates, and as a result, a current that is leaked to the substrate increases. Therefore, the present inventors have investigated a high-withstand voltage diode having a new structure in which a current leaked to the substrate is small.

Other problems and new characteristics will be apparent from description of the specification and the attached drawings.

In one embodiment, there is provided a semiconductor device in which a potential isolation element is provided separately from a diode. The potential isolation element connects a cathode of the diode and a power supply interconnection of a first circuit. A second voltage lower than a power supply potential of the first circuit is applied to an anode of the diode. The potential isolation element includes a first conduction type layer, a second conduction type low-concentration region, a first second-conduction-type high-concentration region, a second second-conduction-type high-concentration region, and a first first-conduction-type region. The second conduction type low-concentration region is formed on the first conduction type layer. The first second-conduction-type high-concentration region is positioned in the second conduction type low-concentration region, and is connected to the cathode of the diode. The second second-conduction-type high-concentration region is positioned in the second conduction type low-concentration region, is disposed to be spaced from the first second-conduction-type high-concentration region, and is connected to a power supply interconnection of the first circuit. The first first-conduction-type region is formed in the second conduction type low-concentration region, a lower portion thereof is connected to the first conduction type layer, and a ground potential is applied thereto. In addition, the first first-conduction-type region is positioned in the vicinity of the first second-conduction-type high-concentration region.

According to the embodiment, the diode may have a withstand voltage, and a current that leaked to a substrate may be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 7A to 7C show cross-sectional views illustrating a method of manufacturing a semiconductor device;

DETAILED DESCRIPTION

Figure 1:
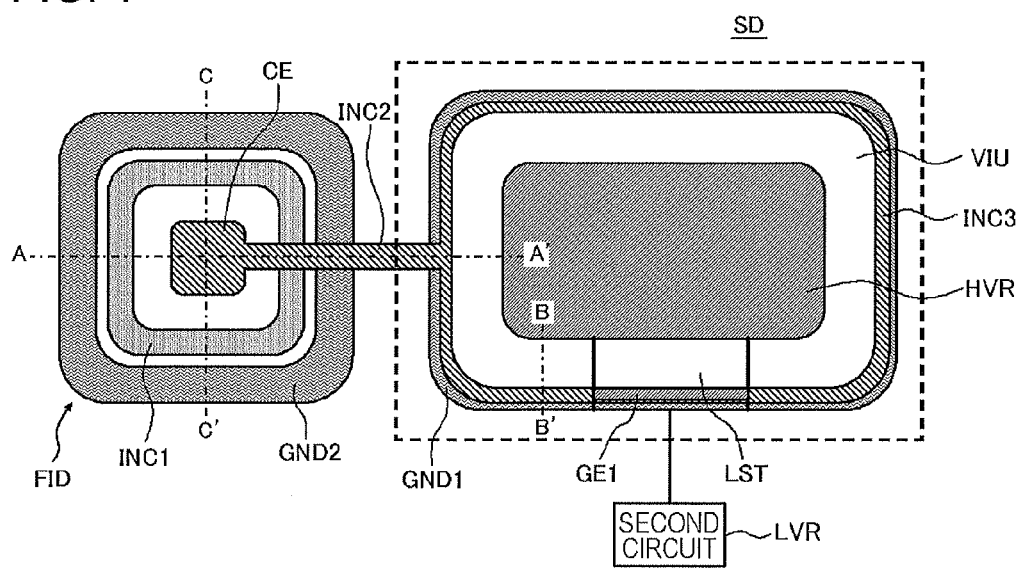
FIG. 1 shows a plan view illustrating a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes. In addition, in the drawings, the same reference numerals will be given to the same constituent elements, and description thereof will not be repeated.

First Embodiment

FIG. 1 shows a plan view illustrating a configuration of a semiconductor device SD according to a first embodiment. The semiconductor device SD includes a first circuit HVR, a diode FID, and a potential isolation element VIU. All of these are formed on the same substrate SUB (not shown in the drawing). In the first circuit HVR, a power supply potential is set to a first voltage. In the diode FID, a second voltage lower than the first voltage is applied to an anode electrode INC1. The potential isolation element VIU is located at a position different than that of the diode FID when seen in a plan view, and connects a cathode electrode CE of the diode FID to a power supply interconnection of the first circuit HVR. Specifically, the potential isolation element VIU is connected to the cathode electrode CE of the diode FID through an interconnection INC2 and an interconnection INC3.

The semiconductor device SD controls a power control element which is connected to the outside, for example, a planar type high-withstand voltage MOS transistor, a vertical type MOS transistor, a bipolar transistor, or an insulated gate bipolar transistor (IGBT) by a signal output from the first circuit HVR. The power control element supplies power, for example, to a motor.

Further, the semiconductor device SD includes a second circuit LVR and a level shift element LST. In the second circuit LVR, a power supply potential is set to a second voltage lower than the first voltage, and the second circuit LVR generates a control signal that controls the power control element. The control signal is input to the power control element through the level shift element LST and the first circuit HVR. In addition, the second circuit LVR and the first circuit HVR are different in a power supply potential, and thus these circuits cannot be connected as it is. The level shift element LST is an element that absorbs the difference in the power supply potential, and connects the second circuit LVR and the first circuit HVR. In addition, the level shift element LST is, for example, an MOS transistor, and includes a gate electrode GE1. In addition, in the drawing, the gate electrode GE1 is shown on the interconnection INC3 for explanation.

As described above, the first circuit HVR and the second circuit LVR are different in the power supply potential. Therefore, it is necessary to electrically separate the first circuit HVR and the second circuit LVR. In the embodiment, the potential isolation element VIU surrounds the first circuit HVR. In addition, the second circuit LVR is positioned at the outside of the potential isolation element VIU. Accordingly, the first circuit HVR and the second circuit LVR are electrically separated by the potential isolation element VIU.

In addition, the potential isolation element VIU is surrounded by a ground interconnection GND1, and the diode FID is surrounded by a ground interconnection GND2.

Figure 2:
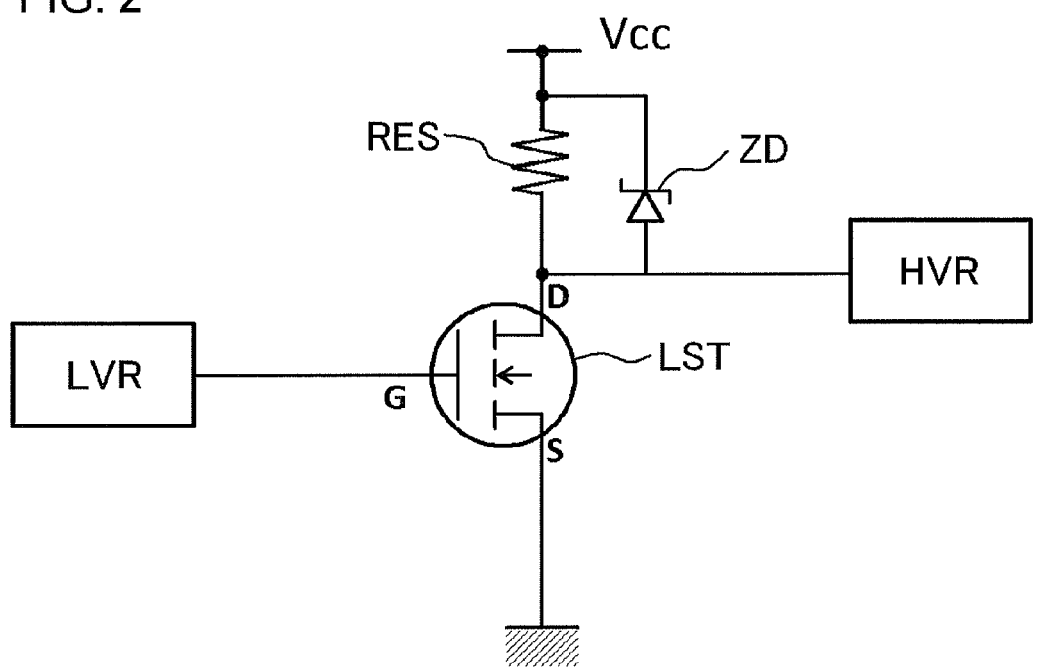
FIG. 2 shows a view illustrating a connection relationship of a signal line in the semiconductor device shown in FIG. 1.

FIG. 2 shows a view illustrating a connection relationship of a signal line in the semiconductor device SD shown in FIG. 1. A gate of the level shift element LST is connected to the second circuit LVR. In addition, a source of the level shift element LST is grounded, and a drain of the level shift element LST is connected to the first circuit HVR. Further, the drain of the level shift element LST is connected to a power supply interconnection of the second circuit LVR. A resistor RES and a zener diode ZD are connected in parallel between the power supply interconnection of the second circuit LVR and the drain of the level shift element LST.

Figure 3:
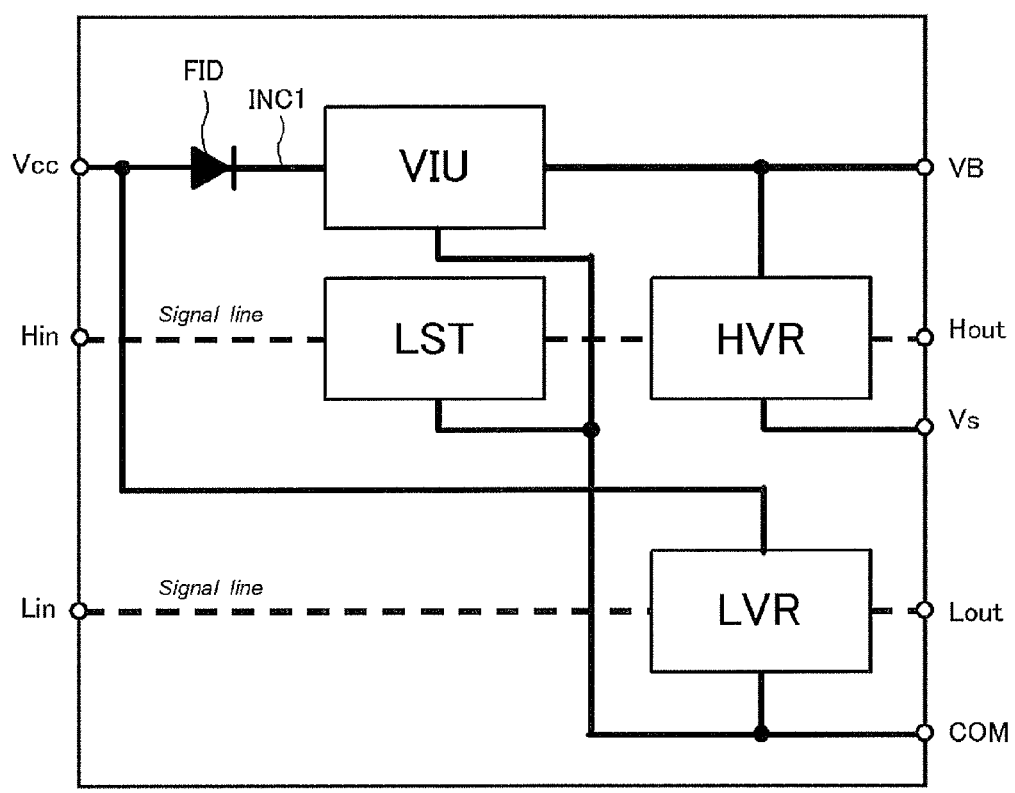
FIG. 3 shows a view illustrating a connection relationship of a power supply line of the semiconductor device shown in FIG. 1.

FIG. 3 shows a view illustrating a connection relationship of a power supply line of the semiconductor device SD shown in FIG. 1. The power supply interconnection Vcc of the second circuit LVR is connected to a power supply interconnection VB of the first circuit HVR through the diode FID and the potential isolation element VIU. In addition, a ground potential of the potential isolation element VIU, the level shift element LST, and the second circuit LVR is set to be common (COM) to each other. However, the ground potential of the first circuit HVR is different from the COM.

Figure 4:
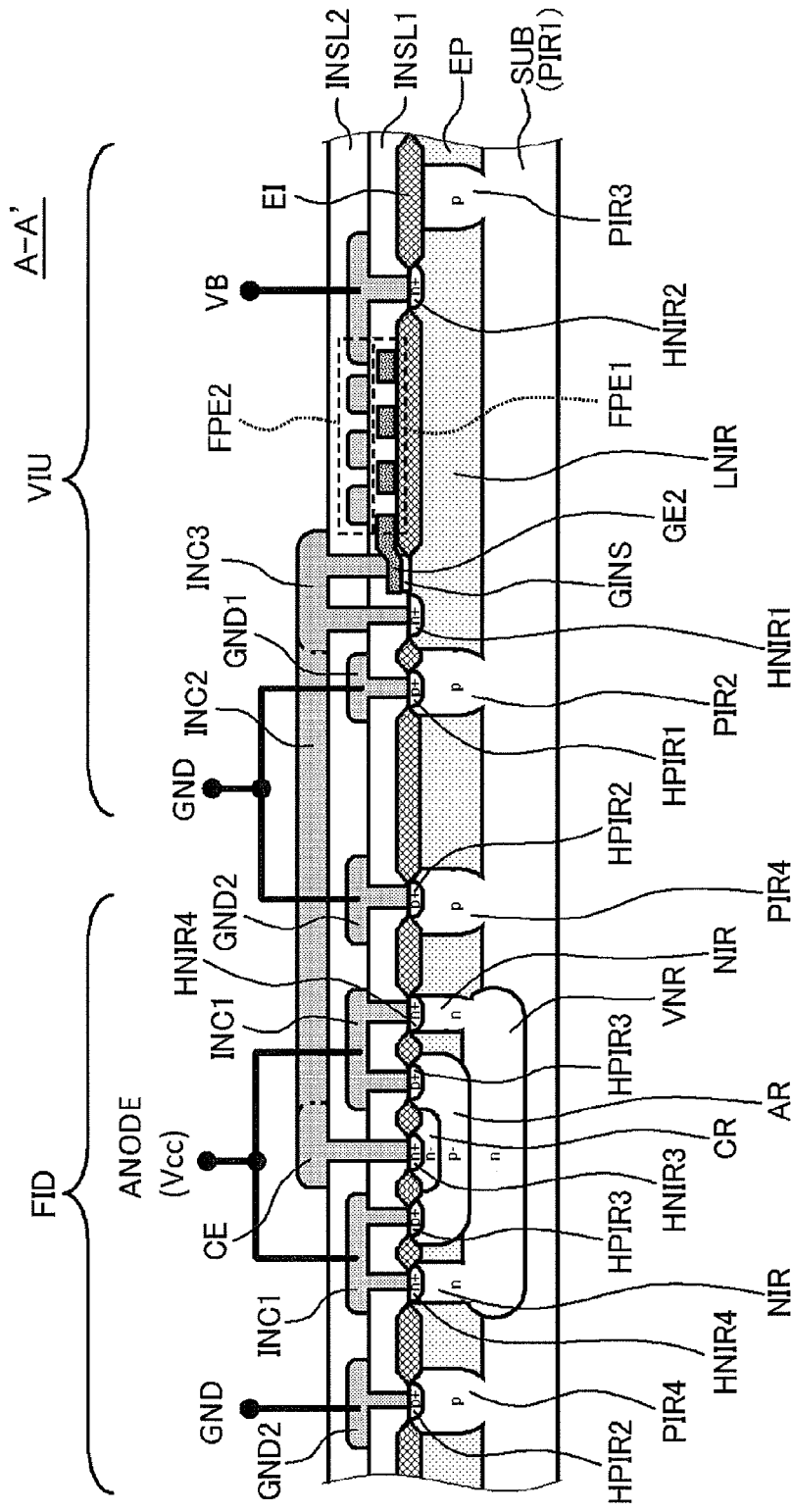
FIG. 4 shows a cross-sectional view taken along a line A-A' of FIG. 1.

FIG. 4 shows a cross-sectional view taken along a line A-A' of FIG. 1. The semiconductor device SD is formed using a p-type substrate SUB. An n-type epitaxial layer EP is formed on the substrate SUB. In addition, an interconnection layer is formed on the n-type epitaxial layer EP. In an example shown in the drawing, the interconnection layer includes an insulating interlayer INSL1 and an insulating interlayer INSL2, and thus the interconnection layer has a two-layer structure. In addition, the anode electrode INC1 is formed in the interconnection layer of the first layer, and the cathode electrode CE, the ground interconnection GND1, the ground interconnection GND2, the interconnection INC2, and the interconnection INC3 are formed in the interconnection layer of the second layer. The anode electrode INC1 is connected to the power supply interconnection Vcc of the second circuit. In addition, the same ground potential is applied to the ground interconnection GND1 and the ground interconnection GND2. In addition, respective elements of the diode FID, the potential isolation element VIU, the first circuit HVR, and the second circuit LVR are formed using the substrate SUB, the n-type epitaxial layer EP, and the interconnection layer.

Figure 5:
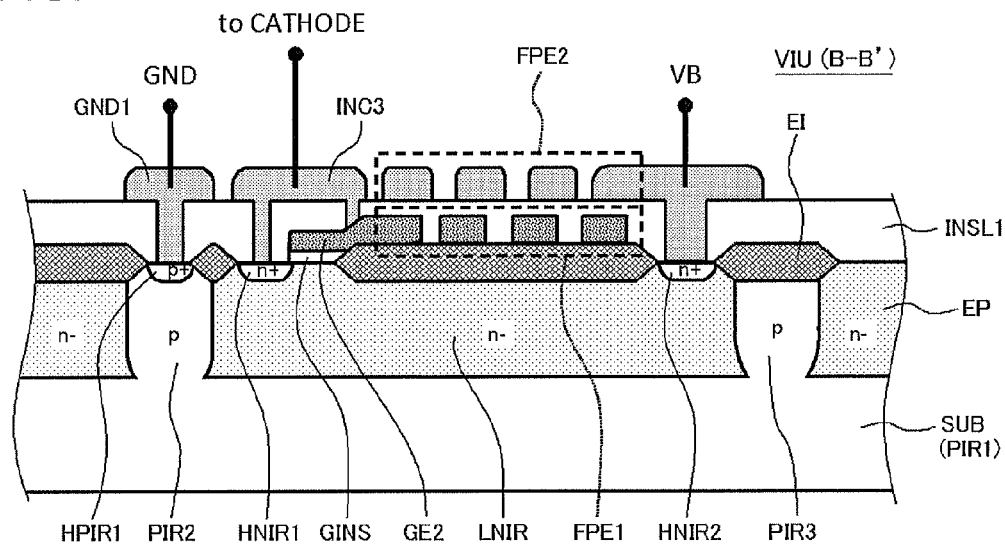
FIG. 5 shows a cross-sectional view taken along a line B-B' of FIG. 1.

First, a configuration of the potential isolation element VIU will be described with reference to FIGS. 4 and 5. FIG. 5 shows a cross-sectional view taken along a line B-B' of FIG. 1. However, in FIG. 5, a position of the interconnection INC3 is shown differently from FIG. 4 for explanation. The semiconductor device SD is formed using the substrate SUB. A first conduction type layer (P-type layer PIR1), a second conduction type low-concentration region (n-type low-concentration region LNIR), a first second-conduction-type high-concentration region (first high-concentration N-type region HNIR1), a second second-conduction-type high-concentration region (second high-concentration N-type region HNIR2), and a first first-conduction-type region (first P-type region PIR2) are formed on/over the substrate SUB.

The second conduction type low-concentration region (n-type low-concentration region LNIR) is formed on the first conduction type layer (P-type layer PIR1). The first second-conduction-type high-concentration region (first high-concentration N-type region HNIR1) is positioned in the second conduction type low-concentration region (n-type low-concentration region LNIR), and is connected to the cathode electrode CE of the diode FID. The second second-conduction-type high-concentration region (second high-concentration N-type region HNIR2) is positioned in the second conduction type low-concentration region (n-type low-concentration region LNIR), is disposed to be spaced from the first second-conduction-type high-concentration region, and is connected to the power supply interconnection VB of the first circuit HVR. The first first-conduction-type region (first P-type region PIR2) is formed in the second conduction type low-concentration region (n-type low-concentration region LNIR), and a bottom portion thereof is connected to the first conduction type layer (P-type layer PIR1). A ground potential is applied to the first first-conduction-type region (first P-type region PIR2), and the first first-conduction-type region (first P-type region PIR2) is located in the vicinity of the first second-conduction-type high-concentration region (first high-concentration N-type region HNIR1).

In the following description, the first conduction type is referred to as a p-type, and the second conduction type is referred to as an n-type. However, the first conduction type may be an n-type and the second conduction type may be a p-type.

The substrate SUB is, for example, a p-type semiconductor substrate such as a silicon substrate, and also functions as the P-type layer PIR1. The n-type epitaxial layer EP is formed on the substrate SUB. In a case where the substrate SUB is a silicon substrate, the n-type epitaxial layer EP is an n-type silicon layer. A part of the n-type epitaxial layer EP functions as the n-type low-concentration region LNIR.

The first P-type region PIR2, the first high-concentration N-type region HNIR1, and the second high-concentration N-type region HNIR2 are formed in the n-type epitaxial layer EP. These regions are formed by ion-implanting impurities to the n-type epitaxial layer EP.

Further, a second P-type region PIR3 is also formed in the n-type epitaxial layer EP. A bottom portion of the second P-type region PIR3 is connected to the P-type layer PIR1 (substrate SUB), and the second P-type region PIR3 is positioned in the vicinity of the second high-concentration N-type region HNIR2.

In addition, a first P-type high-concentration region HPIR1 is formed in a surface layer of the first P-type region PIR2 to lower a contact resistance. The first P-type high-concentration region HPIR1 is also formed by ion-implanting p-type impurities to the n-type epitaxial layer EP.

In addition, an element isolation film EI is formed between the first high-concentration N-type region HNIR1 and the second high-concentration N-type region HNIR2. Field plate electrodes FPE1 and FPE2 are formed on the element isolation film EI in order for the potential isolation element VIU to have a withstand voltage. The field plate electrode FPE1 is positioned at the same layer as the gate electrode GE1 of the level shift element LST, and is formed from the same material as the gate electrode GE1. The field plate electrode FPE2 is formed at the interconnection layer of the first layer. All of a plurality of the field plate electrodes FPE1 and the field plate electrodes FPE2 are disposed to be spaced from each other between the first high-concentration N-type region HNIR1 and the second high-concentration N-type region HNIR2. However, when seen in a plan view, the field plate electrode FPE1 is disposed to fill a gap between the field plate electrodes FPE2, and the field plate electrode FPE2 is disposed to fill a gap between the filed plate electrodes FPE1.

In addition, in the element isolation film EI between the first high-concentration N-type region HNIR1 and the second high-concentration N-type region HNIR2, an end on a first high-concentration N-type region HNIR1 side is covered with the gate electrode GE2 to mitigate electric field concentration. A part of the gate electrode GE2 is also positioned over the n-type low-concentration region LNIR. A gate insulating film GINS is formed on the n-type low-concentration region LNIR which is located at a portion below the gate electrode GE2. For example, the gate insulating film GINS is formed by the same process as a gate insulating film of the level shift element LST. In addition, the gate electrode GE2 is connected to the cathode electrode CE through the interconnections INC3 and the INC2.

Figure 6:
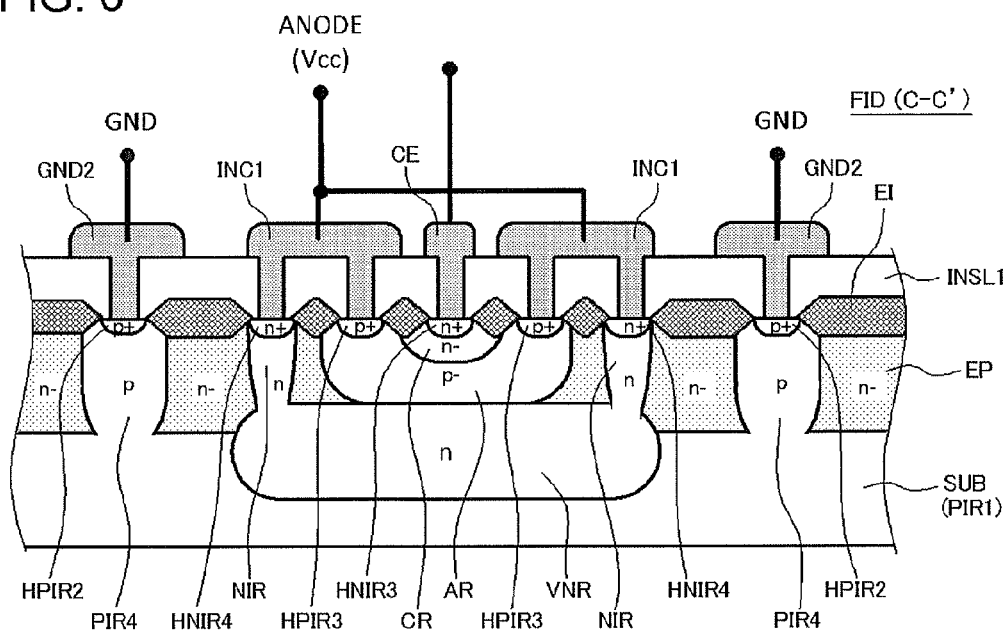
FIG. 6 shows a cross-sectional view taken along a line C-C' of FIG. 1.

Next, a configuration of the diode FID will be described with reference to FIGS. 4 and 6. FIG. 6 shows a cross-sectional view taken along a line C-C' of FIG. 1. However, in FIG. 6, a position of the cathode electrode CE is shown differently from FIG. 4 for illustration. As shown in FIGS. 4 and 6, the diode FID includes an n-type region CR, a third high-concentration N-type region HNIR3, and a p-type region AR. The third high-concentration N-type region HNIR3 is formed in a surface layer of the n-type region CR, and is connected to the cathode electrode CE through a contact. The n-type region CR is formed at a part of the surface layer of the p-type region AR. In addition, a third high-concentration P-type region HPIR3 is formed in a surface layer of the p-type region AR at a portion on an outer side of the n-type region CR. The third high-concentration P-type region HPIR3 is connected to the anode electrode INC1 through a contact. That is, the cathode of the diode FID is the n-type region CR and has the same conduction type as the first high-concentration N-type region HNIR1. Accordingly, a current may be allowed to flow from the diode FID to the first high-concentration N-type region HNIR1.

In addition, the diode FID includes an N-type buried layer VNR and an n-type region NIR. The N-type buried layer VNR is formed below the p-type region AR, and a top surface thereof is connected to the p-type region AR. In addition, when seen in a plan view, the N-type buried layer VNR is larger than the p-type region AR. The n-type region NIR is connected to the top surface of the N-type buried layer VNR at a portion on an outer side of p-type region AR. A surface of the n-type region NIR reaches a surface of the n-type epitaxial layer EP, and a fourth high-concentration N-type region HNIR4 is formed in the surface of the n-type region NIR. The fourth high-concentration N-type region HNIR4 is connected to the anode electrode INC1 through a contact.

In addition, the diode FID is surrounded by a p-type region PIR4. The bottom surface of the p-type region PIR4 is connected to the substrate SUB, and a second high-concentration P-type region HPIR2 is formed in a surface layer of the p-type region PIR4. The second high-concentration P-type region HPIR2 is connected to the ground interconnection GND2 through a contact.

In addition, the element isolation film EI is formed between the fourth high-concentration N-type region HNIR4 and the third high-concentration P-type region HPIR3, and the element isolation film EI is also formed between the third high-concentration P-type region HPIR3 and the third high-concentration N-type region HNIR3.

FIGS. 7A to 9 show cross-sectional views illustrating a method of manufacturing the semiconductor device SD. First, as shown in FIG. 7A, the substrate SUB is prepared. Subsequently, a resist pattern PR1 is formed on the substrate SUB, n-type impurities are ion-implanted to the substrate SUB using the resist pattern PR1 as a mask. According to this, the N-type buried layer VNR is formed in the substrate SUB.

Then, as shown in FIG. 7B, the resist pattern PR1 is removed. Subsequently, a resist pattern PR2 is formed on the substrate SUB, and p-type impurities are ion-implanted to the substrate SUB using the resist pattern PR2 as a mask. According to this, a part of the first P-type region PIR2, a part of the second P-type region PIR3, and a part of the p-type region PIR4 are formed.

Then, as shown in FIG. 7C, the resist pattern PR2 is removed. Then, the substrate SUB is heat-treated to activate and diffuse the impurities implanted to the substrate SUB.

Figure 8A:
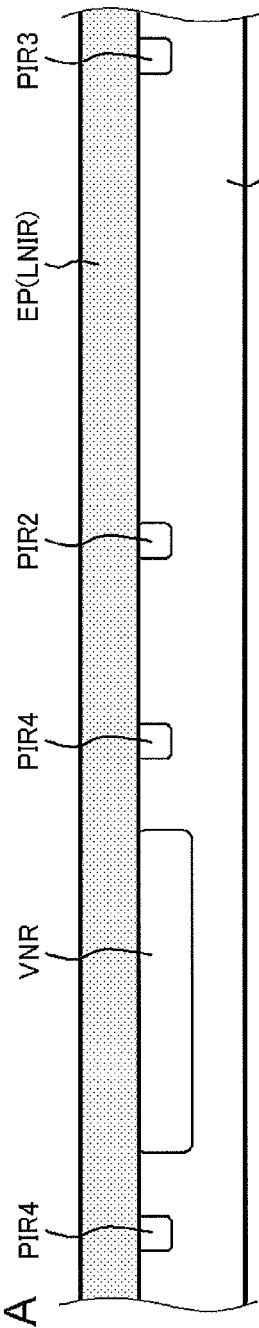
FIGS. 8A to 8C show cross-sectional views illustrating the method of manufacturing a semiconductor device.

Subsequently, as shown in FIG. 8A, the n-type epitaxial layer EP is allowed to grow on the substrate SUB.

Figure 8B:
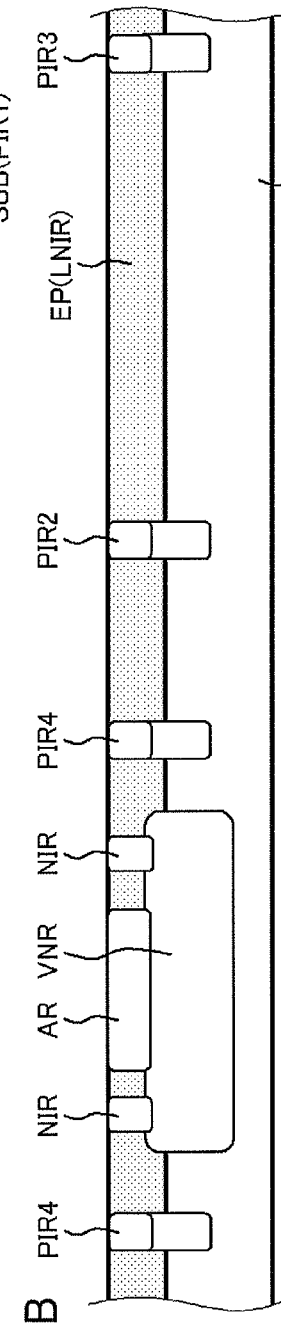

Subsequently, as shown in FIG. 8B, a resist pattern (not shown) is formed on the n-type epitaxial layer EP, and n-type impurities are implanted to the n-type epitaxial layer EP. According to this, the remaining portion of the n-type region NIR is formed in the n-type epitaxial layer EP. Then, the resist pattern is removed. Subsequently, a next resist pattern (not shown) is formed on the n-type epitaxial layer EP. P-type impurities are implanted to the n-type epitaxial layer EP. According to this, the p-type region AR, the remaining portion of the p-type region PIR4, the remaining portion of the first p-type region PIR2, and the remaining portion of the second P-type region PIR3 are formed in the n-type epitaxial layer EP. Then, the resist pattern is removed.

In addition, the substrate SUB and the n-type epitaxial layer EP are heat-treated. According to this, the impurities introduced to the n-type epitaxial layer EP are activated. In addition, the impurities diffuse inside the n-type epitaxial layer EP.

Figure 8C:
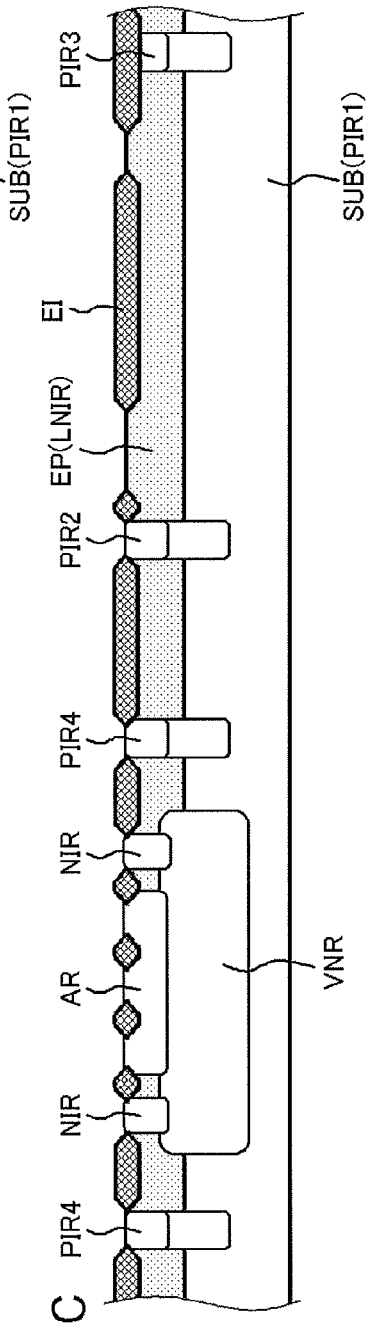

Subsequently, as shown in FIG. 8C, the element isolation film EI is formed using a LOCOS oxidizing method. In addition, the element isolation film EI may be formed using a trench isolation method.

Figure 9:
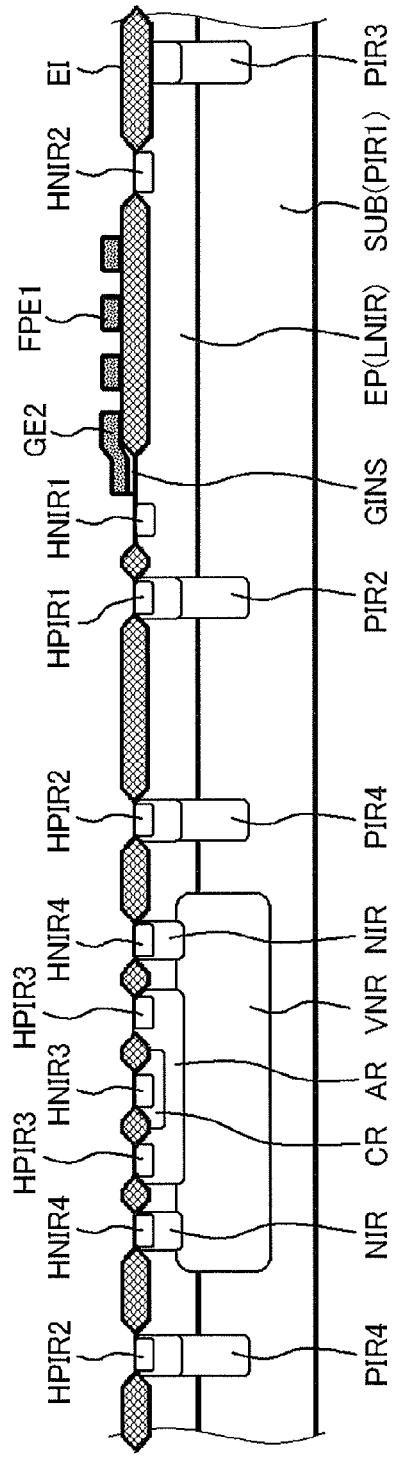
FIG. 9 shows a cross-sectional view illustrating the method of manufacturing a semiconductor device.

Subsequently, as shown in FIG. 9, the n-type epitaxial layer EP is thermally oxidized. According to this, the gate insulating film GINS is formed. Subsequently, a conductive film (for example, a polysilicon film) is formed on the gate insulating film GINS and the element isolation film EI, and this conductive film is selectively removed. According to this, the gate electrode GE2 and the field plate electrode FPE1 are formed.

Subsequently, a resist pattern (not shown) is formed on the n-type epitaxial layer EP and the element isolation film EI, and n-type impurities are implanted to the n-type epitaxial layer EP. According to this, the n-type region CR is formed in the n-type epitaxial layer EP. Then, the resist pattern is removed.

Subsequently, a resist pattern is formed on the n-type epitaxial layer EP, and n-type impurities are implanted to the n-type epitaxial layer EP. According to this, the first high-concentration N-type region HNIR1, the second high-concentration N-type region HNIR2, the third high-concentration N-type region HNIR3, and the fourth high-concentration N-type region HNIR4 are formed in the n-type epitaxial layer EP. Then, the resist pattern is removed. Subsequently, a next resist pattern (not shown) is formed on the n-type epitaxial layer EP, and p-type impurities are implanted to the n-type epitaxial layer EP. According to this, the first P-type high-concentration region HPIR1 and the second high-concentration P-type region HPIR2 are formed in the n-type epitaxial layer EP.

Next, the insulating interlayer INSL1 (for example, a silicon oxide film) is formed on the n-type epitaxial layer EP and the element isolation film EI. Subsequently, the contact is buried in the insulating interlayer INSL1, and the anode electrode INC1, the ground interconnection GND1, the ground interconnection GND2, and the field plate electrode FPE2 are formed on the insulating interlayer INSL1. These electrodes are formed from Al, but may be formed from other conductive materials.

Further, the insulating interlayer INSL2 (for example, a silicon oxide film) is formed on these interconnections and the insulating interlayer INSL1. Subsequently, a contact is buried in the insulating interlayer INSL2, and the cathode electrode CE, the interconnection INC2, and the interconnection INC3 are formed on the insulating interlayer INSL2. For example, these electrode and interconnections are formed from Al, but may be formed from other conductive materials.

In addition, at least a part of an element (for example, a transistor) that constitutes the first circuit HVR, an element (for example, a transistor) that constitutes the second circuit LVR, and the power control element are formed by the processes shown in FIGS. 8B to 9. In this manner, the semiconductor device SD shown in FIGS. 1 to 6 is formed.

As described above, according to the embodiment, the potential isolation element VIU and the diode FID are provided in a series in this order between the power supply interconnection VB of the first circuit HVR and the power supply interconnection Vcc of the second circuit LVR. In addition, most of the potential difference between the power supply interconnection VB and the power supply interconnection Vcc is absorbed by the n-type low-concentration region LNIR of the potential isolation element VIU. Accordingly, even when the diode FID itself does not have a withstand voltage structure, the same effect as a case in which the diode between the power supply interconnection VB and the power supply interconnection Vcc has a withstand voltage may be obtained.

Specifically, the bottom surface of the n-type low-concentration region LNIR of the potential isolation element VIU comes into contact with the P-type layer PIR1. Accordingly, it is easy for the n-type low-concentration region LNIR to be depleted. In addition, the first P-type region PIR2 is formed in the vicinity of the first high-concentration N-type region HNIR1 of the n-type low-concentration region LNIR. Accordingly, in the n-type low-concentration region LNIR, it is particularly easy for the vicinity of the first high-concentration N-type region HNIR1 to be depleted. Accordingly, even when a high potential of the second high-concentration N-type region HNIR2 is applied, the potential is sufficiently lowered in front of the first high-concentration N-type region HNIR1.

In addition, in the embodiment, the second P-type region PIR3 is formed in the vicinity of the second high-concentration N-type region HNIR2. Accordingly, it is particularly easy for the n-type low-concentration region LNIR to be depleted.

In addition, all of current paths in the potential isolation element VIU are formed from an n-type impurity region. Accordingly, a parasitic transistor is not formed, and as a result, a current leaked to the substrate SUB is small.

Second Embodiment

Figure 10:
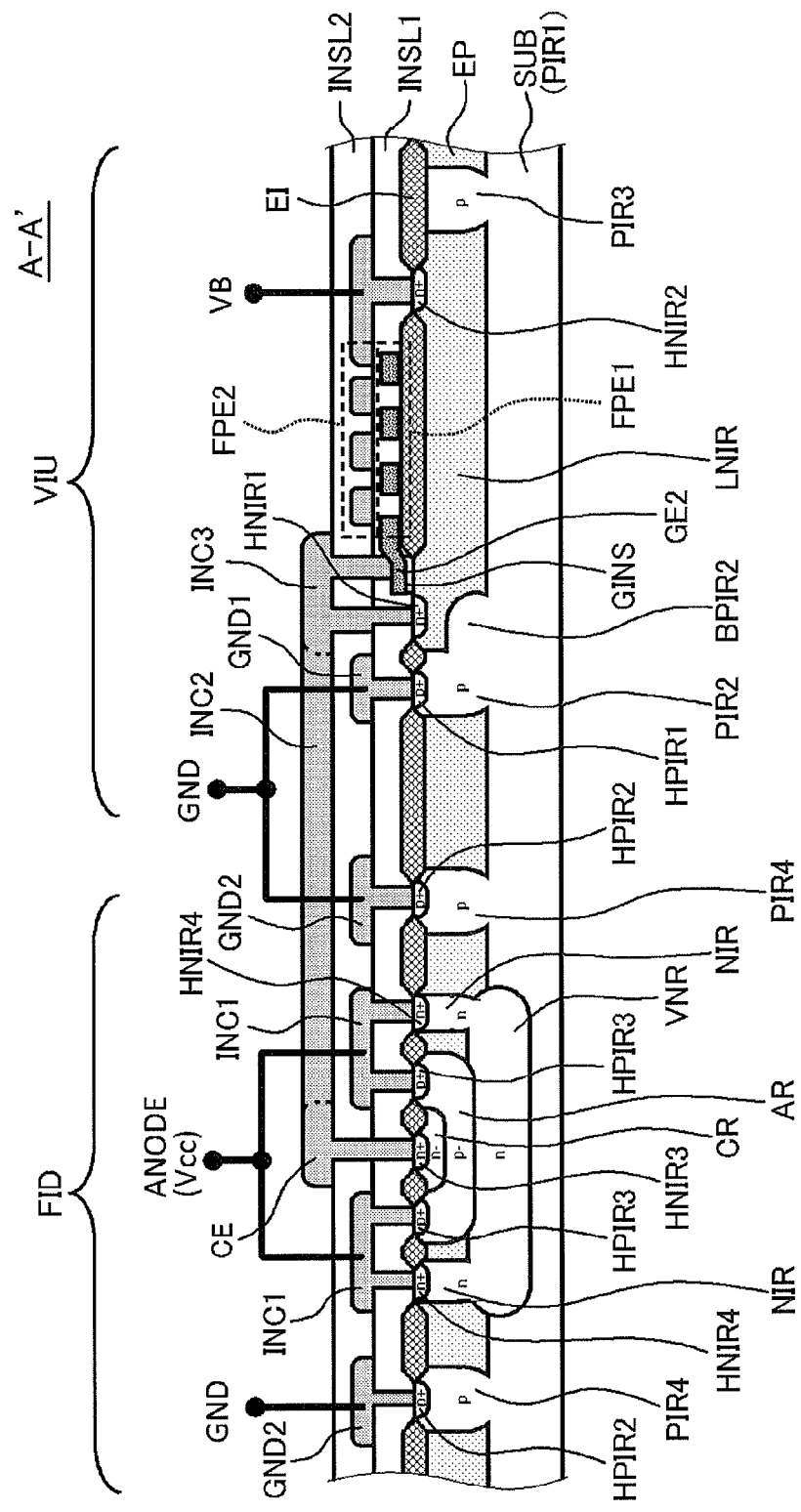
FIG. 10 shows a cross-sectional view illustrating a configuration of a semiconductor device according to a second embodiment.
Figure 11:
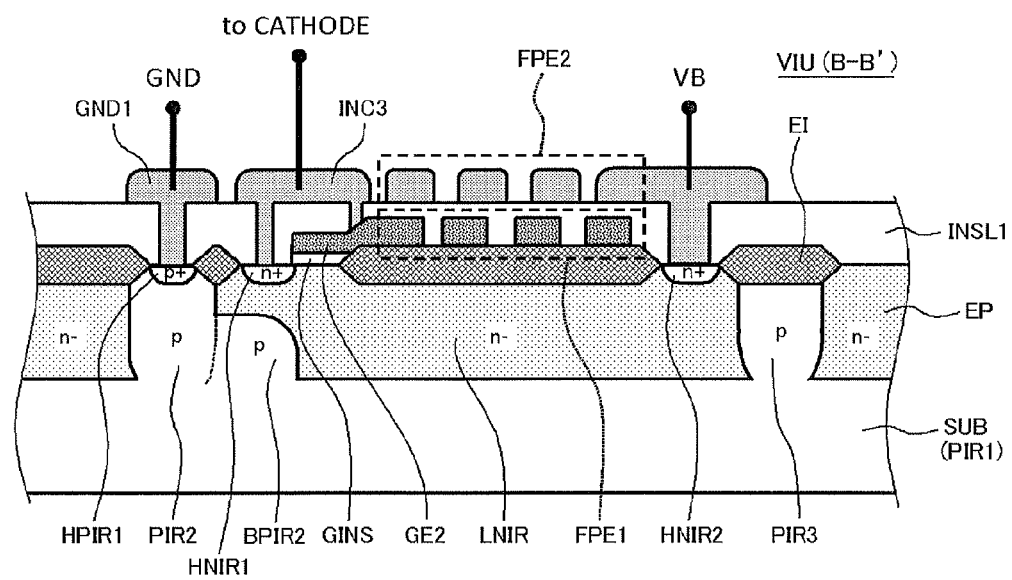
FIG. 11 shows an enlarged view of a region in which a potential isolation element of the semiconductor device shown in FIG. 10 is formed.

FIG. 10 shows a cross-sectional view illustrating a configuration of a semiconductor device SD according to a second embodiment, and corresponds to FIG. 4 in the first embodiment. FIG. 11 shows an enlarged view of a region in which a potential isolation element VIU of the semiconductor device SD shown in FIG. 10 is formed. The semiconductor device SD according to the embodiment has the same configuration as the semiconductor device SD according to the first embodiment except that the first P-type region PIR2 includes an overhang region BPIR2.

The overhang region BPIR2 is a portion formed by overhanging a lower portion of the first P-type region PIR2 toward a lower side of the first high-concentration N-type region HNIR1. When seen in a plan view, it is preferable that the overhang region BPIR2 overlap at least a part of the first high-concentration N-type region HNIR1. When seen in a plan view, it is preferable that the overhang region BPIR2 overlap the entirety of the first high-concentration N-type region HNIR1. As shown in the cross-sectional view, in a depth direction from a surface of a substrate to the inside of the substrate, a distance between the first high-concentration N-type region HNIR1 and the overhang region BPIR2 is configured to be smaller than a distance between the first high-concentration N-type region HNIR1 and the first conduction type layer (P-type layer PIR1).

A method of manufacturing the semiconductor device SD according to the embodiment is the same as the method of manufacturing the semiconductor device SD according to the first embodiment except that the region that becomes the first P-type region PIR2 is broadened in the process shown in FIG. 7B of the first embodiment.

According to the embodiment, the same effect as the first embodiment may be obtained. In addition, since the first P-type region PIR2 overhangs toward the lower side of the first high-concentration N-type region HNIR1, it is easy to form a depletion layer in the n-type low-concentration region LNIR at a portion in the vicinity of the first P-type region PIR2. Accordingly, a potential of the first P-type region PIR2 may be sufficiently lowered. This effect increases as overlapping between the overhang region BPIR2 and the first high-concentration N-type region HNIR1 increases.

Figure 12A:
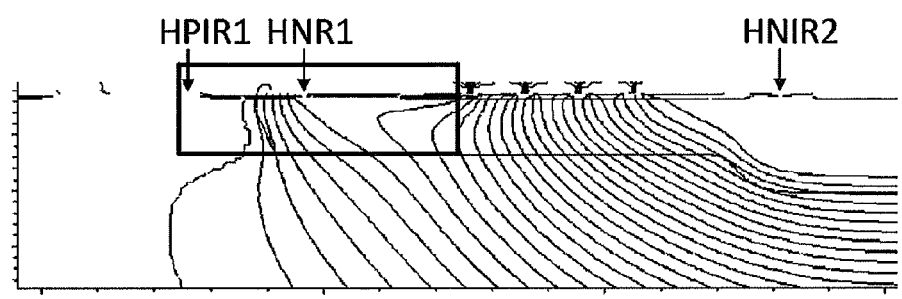
FIGS. 12A and 12B show views illustrating a simulation result of an equipotential line of the semiconductor device according to the first embodiment.
Figure 12B:
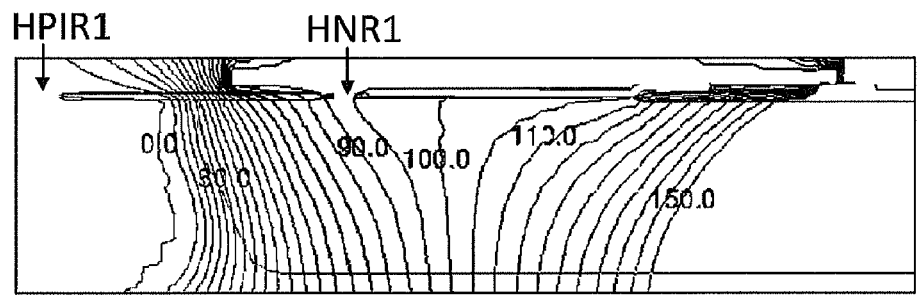
Figure 13A:
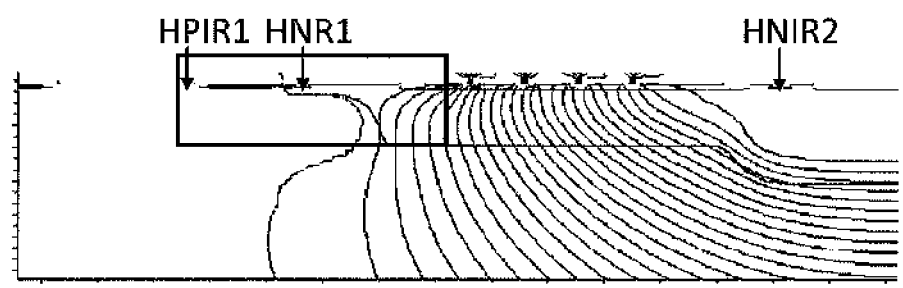
FIGS. 13A and 13B show views illustrating a simulation result of an equipotential line of the semiconductor device according to the second embodiment.
Figure 13B:
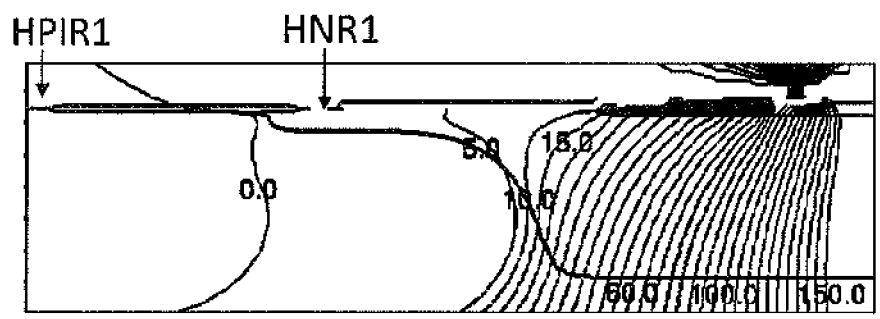

FIG. 12A shows a simulation result of an equipotential line of the semiconductor device SD according to the first embodiment in a case where 800 V is applied to the second high-concentration N-type region HNIR2, and the first high-concentration N-type region HNIR1 is grounded. FIG. 12B is an enlarged view of a region surrounded by a solid line in FIG. 12A. FIG. 13A shows a simulation result of an equipotential line of the semiconductor device SD according to the second embodiment in a case where 800 V is applied to the second high-concentration N-type region HNIR2, and the first high-concentration N-type region HNIR1 is grounded. FIG. 13B is an enlarged view of a region surrounded by a solid line in FIG. 13A.

As can be seen from comparison between the drawings, the potential of the first P-type region PIR2 is more sufficiently lowered in the potential isolation element VIU according to the second embodiment.

Third Embodiment

Figure 14:
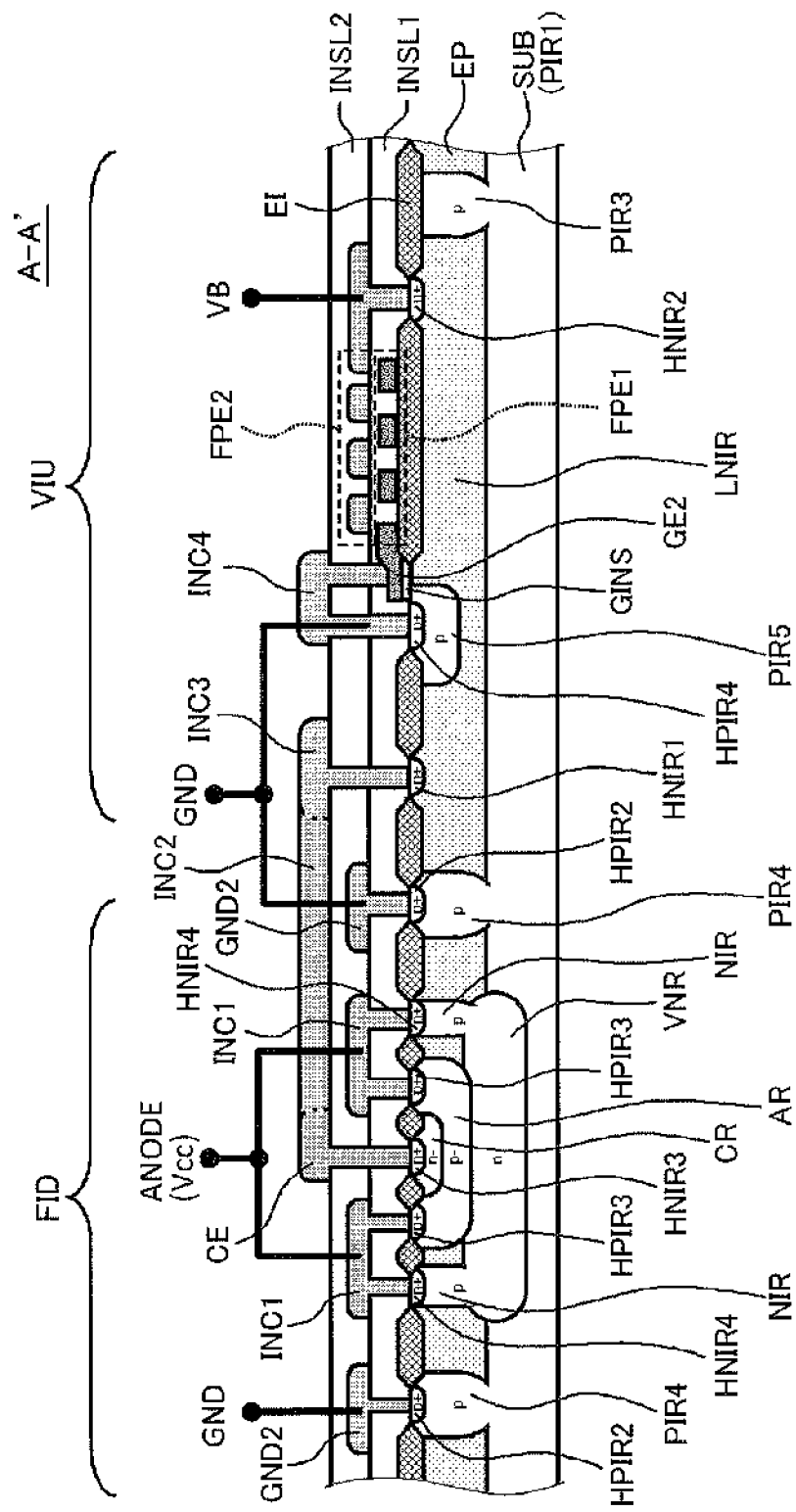
FIG. 14 shows a cross-sectional view illustrating a configuration of a semiconductor device according to a third embodiment.
Figure 15:
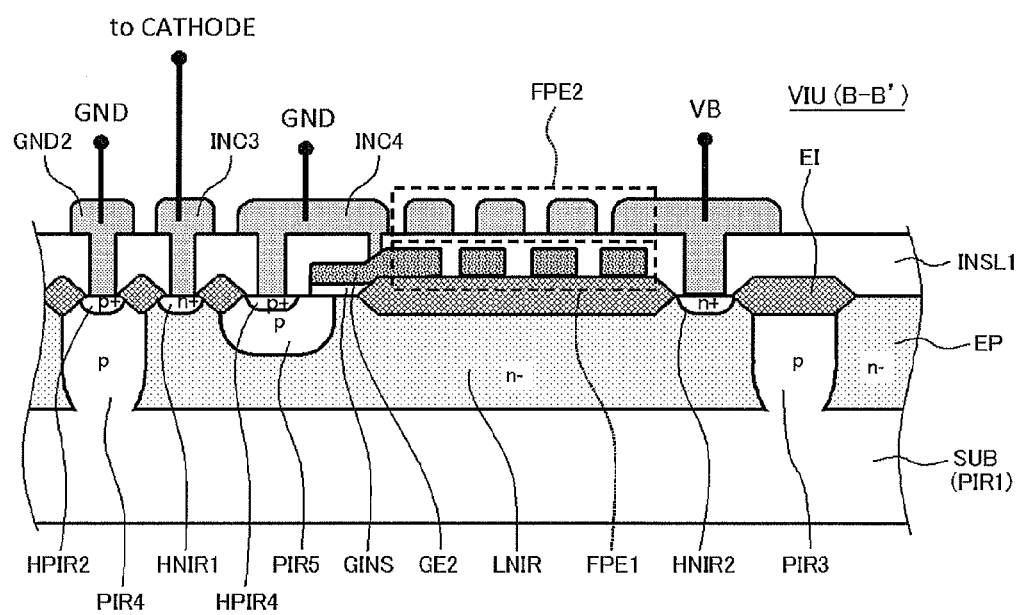
FIG. 15 shows an enlarged view of a region in which a potential isolation element of the semiconductor device shown in FIG. 11 is formed.

FIG. 14 shows a cross-sectional view illustrating a configuration of a semiconductor device SD according to a third embodiment, and corresponds to FIG. 4 in the first embodiment. FIG. 15 shows an enlarged view of a region in which a potential isolation element VIU of the semiconductor device SD shown in FIG. 11 is formed. The semiconductor device SD according to the embodiment has the same configuration as the semiconductor device SD according to the first embodiment except for the following configurations.

First, in the p-type region PIR4, a region positioned in the vicinity of the first high-concentration N-type region HNIR1 also functions as the first P-type region PIR2 in the first embodiment. In addition, when seen in a plan view, a third P-type region PIR5 is formed in a region of the n-type low-concentration region LNIR which is located between the first high-concentration N-type region HNIR1 and the second high-concentration N-type region HNIR2. The third P-type region PIR5 is formed to be shallower than the n-type low-concentration region LNIR. In addition, a fourth high-concentration P-type region HPIR4 is formed in a surface layer of the third P-type layer PIR5. The fourth high-concentration P-type region HPIR4 is connected to the gate electrode GE2 through an interconnection INC4. That is, the fourth high-concentration P-type region HPIR4 is grounded.

A method of manufacturing the semiconductor device SD according to the embodiment has the same configuration as the method of manufacturing the semiconductor device SD according to the first embodiment except that the third P-type region PIR5 is formed in the process shown in FIG. 8B, and the fourth high-concentration P-type region HPIR4 is formed in the process shown in FIG. 9.

Figure 16A:
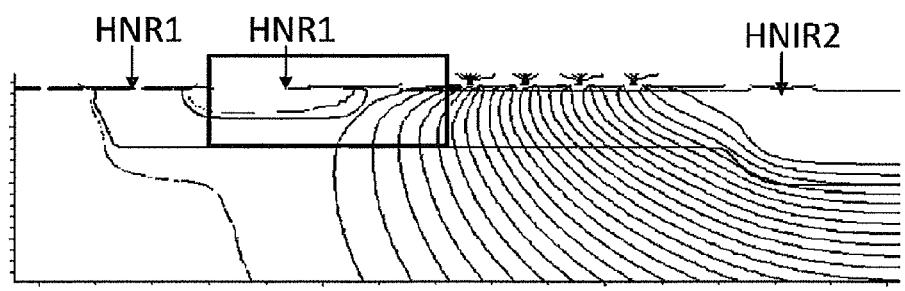
FIGS. 16A and 16B show views illustrating a simulation result of an equipotential line of the semiconductor device according to the third embodiment.
Figure 16B:
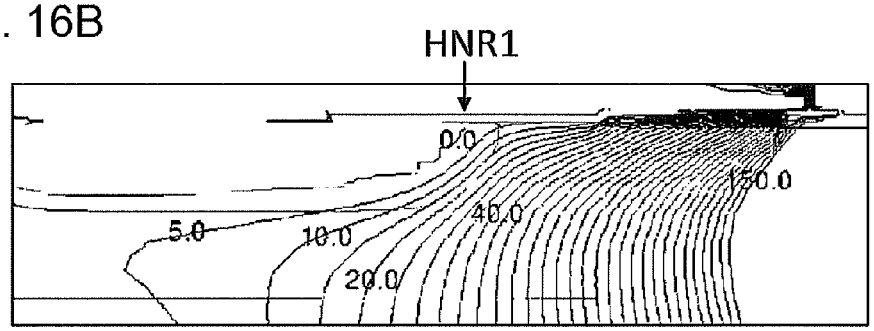

FIG. 16A shows a simulation result of an equipotential line of the semiconductor device SD according to the embodiment in a case where 800 V is applied to the second high-concentration N-type region HNIR2, and the first high-concentration N-type region HNIR1 is grounded. FIG. 16B is an enlarged view of a region surrounded by a solid line in FIG. 16A. As can be seen from the drawings, the potential of the first P-type region PIR2 is also sufficiently lowered in the embodiment. That is, according to the embodiment, the same effect as the second embodiment may be obtained.

Fourth Embodiment

Figure 17:
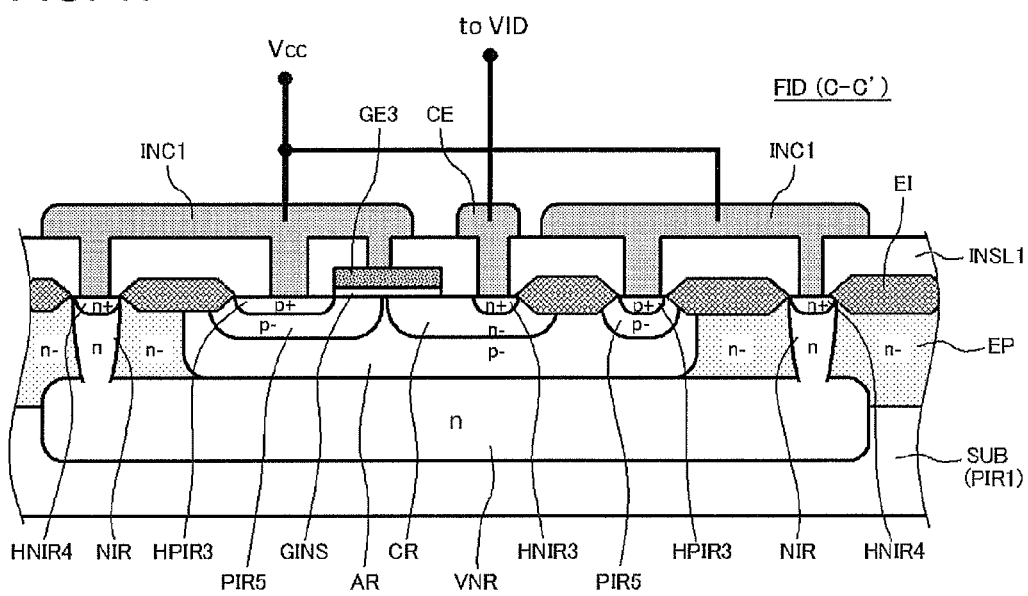
FIG. 17 shows a cross-sectional view illustrating a configuration of a diode provided to a semiconductor device according to a fourth embodiment.

FIG. 17 shows a cross-sectional view illustrating a configuration of a diode FID of a semiconductor device SD according to a fourth embodiment. The semiconductor device SD according to the embodiment has the same configuration as the semiconductor device SD according to any one of the first to third embodiments expect for the configuration of the diode FID. The diode FID according to the embodiment has the same configuration as the diode FID shown in the first embodiment except for the following configurations.

First, the element isolation film EI is not formed at a part between the third high-concentration P-type region HPIR3 and the third high-concentration N-type region HNIR3. In addition, the third P-type region PIR5 and the n-type region CR are adjacent to each other with a gap therebetween in the n-type epitaxial layer EP at a portion at which the element isolation film EI is not formed. Further, the gate insulating film GINS and the gate electrode GE3 are formed at the portion. The gate electrode GE3 is connected to the power supply interconnection Vcc of the second circuit LVR through the anode electrode INC1.

According to the embodiment, the same effect as the first to third embodiments may be obtained.

Hereinbefore, the invention made by the present inventors has been described in detail with reference to the embodiments of the invention, but it is apparent that the present invention is not limited to the above embodiments, and may be modified and changed without departing from the scope and spirit of the invention.

What is claimed is:
1. A semiconductor device, comprising:
a substrate;
a first circuit which is formed on the substrate, and in which a power supply potential is set to a first voltage;
a diode which is formed on the substrate, and in which a second voltage lower than the first voltage is applied to an anode; and
a potential isolation element which is formed on the substrate at a position different from that of the diode when seen in a plan view, and which connects a cathode of the diode to a power supply interconnection of the first circuit, wherein the potential isolation element includes,
a first conduction type layer,
a second conduction type low-concentration region which is formed over the first conduction type layer,
a first second-conduction-type high-concentration region which is positioned in the second conduction type low-concentration region, and which is connected to the cathode of the diode,
a second second-conduction-type high-concentration region which is positioned in the second conduction type low-concentration region and is disposed to be spaced from the first second-conduction-type high-concentration region, and which is connected to the power supply interconnection of the first circuit, and
a first first-conduction-type region which is formed in the second conduction type low-concentration region, whose bottom portion is connected to the first conduction type layer, to which a ground potential is applied, and which is positioned in the vicinity of the first second-conduction-type high-concentration region.

2. The semiconductor device according to claim 1, further comprising:
a second first-conduction-type region which is formed in the second conduction type low-concentration region, whose lower portion is connected to the first conduction type layer, and which is positioned in the vicinity of the second second-conduction-type high-concentration region.

3. The semiconductor device according to claim 1, further comprising:
a third first-conduction-type region which is formed in the second conduction type low-concentration region, which is positioned between the first second-conduction-type high-concentration region and the second second-conduction-type high-concentration region when seen in a plan view, and which is shallower than the second conduction type low-concentration region.

4. The semiconductor device according to claim 1,
wherein the potential isolation element surrounds the first circuit.

5. The semiconductor device according to claim 1,
wherein the cathode of the diode is a second conduction type cathode.

6. The semiconductor device according to claim 1,
wherein a lower portion of the first first-conduction-type region overhangs toward a lower side of the first second-conduction-type high-concentration region.

7. The semiconductor device according to claim 6,
wherein when seen in a plan view, the lower portion of the first first-conduction-type region overlaps at least a part of the first second-conduction-type high-concentration region.

8. The semiconductor device according to claim 7,
wherein when seen in a plan view, the lower portion of the first first-conduction-type region overlaps the entirety of the first second-conduction-type high-concentration region.

* * * * *